(12) United States Patent
Umezawa et al.

(10) Patent No.: US 12,727,386 B2
(45) Date of Patent: Sep. 1, 2026

(54) PIEZOELECTRIC TRANSDUCER INCLUDING FIXING PORTION OVERLAPPING BASE PORTION AND GAP BETWEEN BEAM PORTIONS

(71) Applicant: Murata Manufacturing Co., Ltd., Nagaokakyo (JP)

(72) Inventors: Seiji Umezawa, Nagaokakyo (JP); Shinsuke Ikeuchi, Nagaokakyo (JP); Fumiya Kurokawa, Nagaokakyo (JP); Nobuyoshi Adachi, Nagaokakyo (JP); Yoichi Mochida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1469 days.

(21) Appl. No.: 17/192,940

(22) Filed: Mar. 5, 2021

(65) Prior Publication Data

US 2021/0193901 A1 Jun. 24, 2021

Related U.S. Application Data

(63) Continuation of application No. PCT/JP2019/032100, filed on Aug. 16, 2019.

(30) Foreign Application Priority Data

Dec. 10, 2018 (JP) ................................ 2018-230899

(51) Int. Cl.
*H01L 41/09* (2006.01)
*H01L 41/047* (2006.01)
(Continued)

(52) U.S. Cl.
CPC ....... *H10N 30/2042* (2023.02); *H10N 30/853* (2023.02); *H10N 30/8542* (2023.02); *H10N 30/877* (2023.02)

(58) Field of Classification Search
CPC ............... H10N 30/853; H10N 30/877; H10N 30/2042; H10N 30/8542
(Continued)

(56) References Cited

U.S. PATENT DOCUMENTS 5,049,099 A 9/1991 Ito et al.
2012/0250909 A1* 10/2012 Grosh .................... H10N 30/05 381/174
(Continued)

FOREIGN PATENT DOCUMENTS

JP 60-1097 A 1/1985
JP 02-126798 A 5/1990
(Continued)

OTHER PUBLICATIONS

Official Communication issued in International Patent Application No. PCT/JP2019/032100, mailed on Sep. 10, 2019.

*Primary Examiner* — Emily P Pham
*Assistant Examiner* — Monica Mata
(74) *Attorney, Agent, or Firm* — Keating & Bennett, LLP

(57) ABSTRACT

A piezoelectric transducer includes beam portions supported by a base portion at an end portion and extending in a direction away from the base portion above the base portion. Each beam portion includes a piezoelectric layer, an upper electrode layer on an upper side of the piezoelectric layer, and a lower electrode layer facing at least a portion of the upper electrode layer with the piezoelectric layer interposed therebetween. A fixing portion is disposed on the beam portion to sandwich the end portion of each beam portion between the fixing portion and the base portion. The fixing portion overlaps at least a portion of the base portion in an up-down direction, and extends to protrude from the base portion in an extending direction of the beam portion.

15 Claims, 12 Drawing Sheets

(51) Int. Cl.
*H01L 41/187* (2006.01)
*H10N 30/20* (2023.01)
*H10N 30/853* (2023.01)
*H10N 30/87* (2023.01)

(58) Field of Classification Search
USPC .......................................... 310/330; 311/330
See application file for complete search history.

(56) References Cited

U.S. PATENT DOCUMENTS

2017/0021391 A1* 1/2017 Guedes ................. B06B 1/0603
2017/0246662 A1* 8/2017 Kidwell, Jr. .......... B06B 1/0603

FOREIGN PATENT DOCUMENTS

JP 2014-515214 A 6/2014
JP 2018-098546 A 6/2018

* cited by examiner

FIG. 18
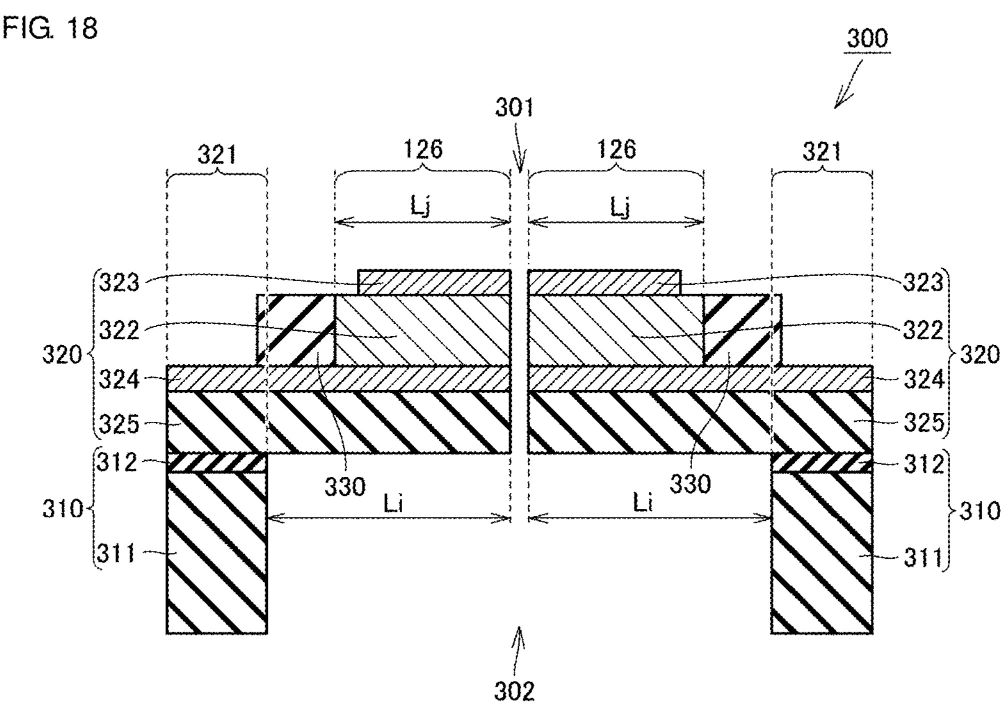
FIG. 19
324
325
312
311
FIG. 20
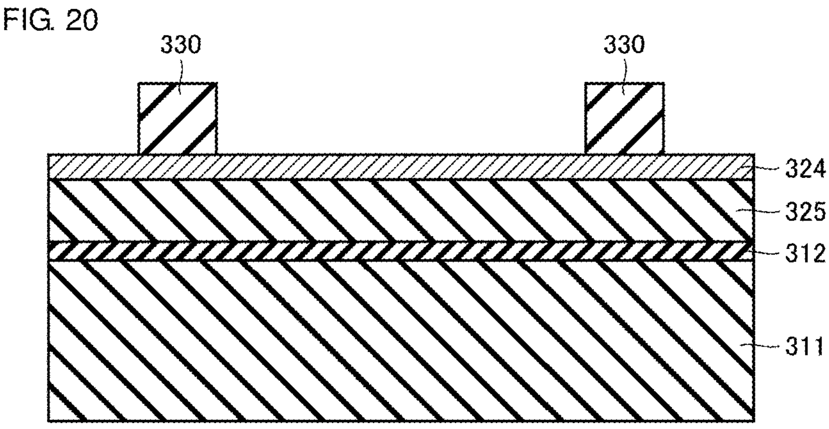

PIEZOELECTRIC TRANSDUCER INCLUDING FIXING PORTION OVERLAPPING BASE PORTION AND GAP BETWEEN BEAM PORTIONS

CROSS REFERENCE TO RELATED APPLICATIONS

This application claims the benefit of priority to Japanese Patent Application No. 2018-230899 filed on Dec. 10, 2018 and is a Continuation Application of PCT Application No. PCT/JP2019/032100 filed on Aug. 16, 2019. The entire contents of each application are hereby incorporated herein by reference.

BACKGROUND OF THE INVENTION

1. Field of the Invention

The present invention relates to a piezoelectric transducer.

2. Description of the Related Art

Japanese Unexamined Patent Application Publication No. 2014-515214 discloses a configuration of a piezoelectric transducer. The piezoelectric transducer described in Japanese Unexamined Patent Application Publication No. 2014-515214 includes a substrate and a plurality of cantilevered beams. The cantilevered beams are adjacent to each other and tapered. Each of the plurality of cantilevered beams defines a beam base portion, a beam tip portion, and a beam body portion. The beam body portion is disposed between the beam base portion and the beam tip portion. Each of the plurality of cantilevered beams is disposed such that the beam tip portion extends toward a common imaginary point. Each of the plurality of cantilevered beams is coupled to the substrate along the beam base portion, and is free from the substrate along the beam body portion.

In a piezoelectric transducer according to the related art, a pattern of a piezoelectric layer or the like is formed on a front surface side of a substrate. Further, a recessed portion is provided for the substrate by deep reactive ion etching (Deep RIE), wet etching, or other processing from a back surface side of the substrate. In a case where an alignment error occurs between the processing on the front surface side and the processing on the back surface side of the substrate, lengths of movable portions of a plurality of beam portions may vary. Accordingly, when the piezoelectric transducer is driven, mechanical characteristics, such as a resonant frequency and a deformation amount of each of the plurality of beam portions, are different from each other, and thus the input/output characteristics of the piezoelectric transducer deteriorate.

SUMMARY OF THE INVENTION

Preferred embodiments of the present invention provide piezoelectric transducers each having improved input/output characteristics by equalizing lengths of movable portions of a plurality of beam portions.

A piezoelectric transducer according to a preferred embodiment the present invention includes a base portion, a plurality of beam portions, and at least one fixing portion. Each of the plurality of beam portions is supported by the base portion at an end portion, and extends in a direction away from the base portion at a position above the base portion. Each of the plurality of beam portions includes a plurality of layers. Each of the plurality of beam portions includes a piezoelectric layer, an upper electrode layer disposed on an upper side of the piezoelectric layer, and a lower electrode layer disposed facing at least a portion of the upper electrode layer with the piezoelectric layer interposed therebetween. The fixing portion is disposed on the beam portion so as to sandwich the end portion of each of the plurality of beam portions between the fixing portion and the base portion. The fixing portion overlaps at least a portion of the base portion in an up-down direction, and extends so as to protrude from the base portion in an extending direction of the beam portion.

According to preferred embodiments of the present invention, it is possible to improve the input/output characteristics of the piezoelectric transducers by equalizing the length of the movable portion of each of the plurality of beam portions.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 18 is a sectional view illustrating a configuration of a piezoelectric transducer according to Preferred Embodiment 3 of the present invention.

FIG. 19 is a sectional view illustrating a state in which a lower electrode layer is provided on an upper surface of an active layer in a method for manufacturing the piezoelectric transducer according to Preferred Embodiment 3 of the present invention.

FIG. 20 is a sectional view illustrating a state in which a fixing portion is provided on an upper surface of the lower electrode layer in the method for manufacturing the piezoelectric transducer according to Preferred Embodiment 3 of the present invention.

DETAILED DESCRIPTION OF THE PREFERRED EMBODIMENTS

Figure 1:
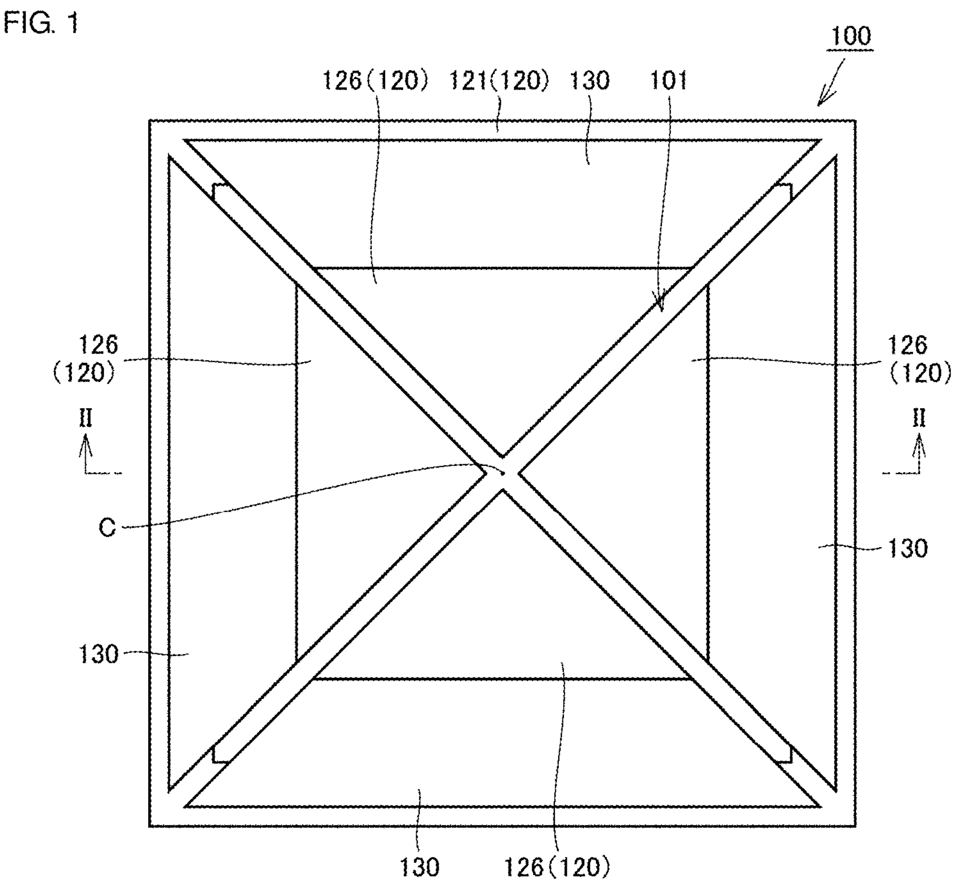
FIG. 1 is a plan view illustrating a configuration of a piezoelectric transducer according to Preferred Embodiment 1 of the present invention.

Hereinafter, piezoelectric transducers according to preferred embodiments of the present invention will be described with reference to the drawings. In the following description of the preferred embodiments, the same or corresponding portions and elements in the drawings are denoted by the same reference numerals, and description thereof will not be repeated.

Preferred Embodiment 1

Figure 2:
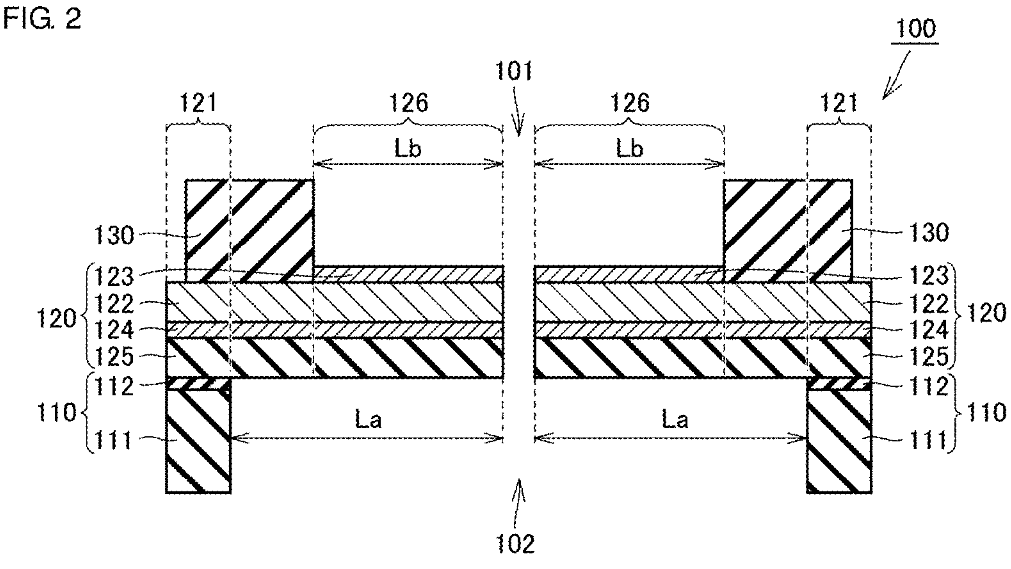
FIG. 2 is a sectional view of the piezoelectric transducer illustrated in FIG. 1 taken along line II-II and viewed from a direction denoted by arrow.

FIG. 1 is a plan view illustrating a configuration of a piezoelectric transducer according to Preferred Embodiment 1 of the present invention. FIG. 2 is a sectional view of the piezoelectric transducer illustrated in FIG. 1 taken along line II-II and viewed from a direction denoted by arrow.

As illustrated in FIG. 1 and FIG. 2, a piezoelectric transducer 100 according to Preferred Embodiment 1 of the present invention includes a base portion 110, a plurality of beam portions 120, and at least one fixing portion 130. In the present preferred embodiment, four fixing portions 130 are provided.

As illustrated in FIG. 2, the base portion 110 is located on a lower side of the end portion 121 of each of the plurality of beam portions 120. Thus, the base portion 110 has an annular outer shape when the piezoelectric transducer 100 is viewed from above, and specifically, has a rectangular or substantially rectangular annular outer shape, similar to the end portion 121 of each of the plurality of beam portions 120 illustrated in FIG. 1.

As illustrated in FIG. 2, in the present preferred embodiment, the base portion 110 has a sectional shape that extends in an up-down direction with a constant or substantially constant width. Note that the base portion 110 may have a sectional shape in which the width becomes wider toward an upper side.

The base portion 110 includes a lower base portion 111 and an upper base portion 112. The upper base portion 112 is layered on the upper portion of the lower base portion 111. In the present preferred embodiment, the lower base portion 111 is preferably made of Si, for example. The upper base portion 112 is preferably made of $SiO_2$, for example.

As illustrated in FIG. 1 and FIG. 2, each of the plurality of beam portions 120 is supported by the base portion 110 at the end portion 121, and extends in a direction away from the base portion 110 at a position above the base portion 110.

Each of the plurality of beam portions 120 has an outer shape that is tapered in an extending direction of the beam portion 120 when the piezoelectric transducer 100 is viewed from above. Specifically, each of the plurality of beam portions 120 preferably has, for example, a triangular or substantially triangular outer shape when the piezoelectric transducer 100 is viewed from above. In the present preferred embodiment, the triangular or substantially triangular shape is an isosceles triangle shape, for example.

Note that when the piezoelectric transducer 100 is viewed from above, each of the plurality of beam portions 120 may have an outer shape having a constant width in the extending direction of the beam portion 120, or may have an outer shape such that the width thereof gradually increases in the extending direction of the beam portion 120. Each of the plurality of beam portions 120 may have a rectangular or substantially rectangular outer shape, for example. A piezoelectric transducer according to a modified example in which the shape and the arrangement of the beam portions 120 are different will be described later.

As illustrated in FIG. 1, in the present preferred embodiment, the piezoelectric transducer includes four beam portions 120. The plurality of beam portions 120 are disposed so as to be point-symmetrical to each other with respect to an imaginary center point C of the piezoelectric transducer 100 when the piezoelectric transducer 100 is viewed from above. In the present preferred embodiment, the four beam portions 120 are each disposed such that, when the piezoelectric transducer 100 is viewed from above, extending directions of adjacent beam portions 120 are different from each other by about 90° while extending in different directions from each other.

In the present preferred embodiment, the extending directions of the plurality of beam portions 120 extend toward the imaginary center point C when the piezoelectric transducer 100 is viewed from above. Note that the extending direction of each of the plurality of beam portions 120 may extend away from the imaginary center point, or may not necessarily be directed toward the imaginary center point C.

As illustrated in FIG. 1 and FIG. 2, each of the plurality of beam portions 120 is configured such that the end portions 121 of adjacent beam portions 120 are continuous with each other. As described above, the end portions 121 of the plurality of beam portions 120 are configured to be continuous to have an annular outer shape when the piezoelectric transducer 100 is viewed from above, and specifically, preferably have a rectangular or substantially rectangular annular outer shape.

The plurality of beam portions 120 are spaced away from each other with a gap 101 interposed therebetween. In the present preferred embodiment, the gap 101 located between the plurality of beam portions 120 extends radially from the imaginary center point C when the piezoelectric transducer 100 is viewed from above. In the extending direction of the gap 101, a width of the gap 101 is constant or substantially constant.

As illustrated in FIG. 1 and FIG. 2, in the present preferred embodiment, a tip portion of each of the plurality of beam portions 120 is a free end spaced apart from the base portion 110. Note that the tip portion of each of the plurality of beam portions 120 may be connected to a plate-shaped portion that vibrates up and down when the piezoelectric transducer 100 is driven. A piezoelectric transducer according to a modified example having a plate-shaped portion will be described later.

As illustrated in FIG. 2, each of the plurality of beam portions 120 includes a plurality of layers. Each of the plurality of beam portions 120 includes a piezoelectric layer 122, an upper electrode layer 123, and a lower electrode layer 124.

In the present preferred embodiment, the piezoelectric layer 122 is positioned over the entire or substantially the entire length from the end portion 121 side to the tip portion side in the extending direction of the beam portion 120. Further, the piezoelectric layer 122 is disposed over the entire or substantially the entire width direction orthogonal or substantially orthogonal to the extending direction of the beam portion 120.

The piezoelectric layer 122 may preferably be made of, for example, a polycrystalline material, or may preferably be made of, for example, a single crystal material. The piezoelectric layer 122 is preferably made of lead zirconate titanate (PZT) based ceramics, aluminum nitride (AlN), lithium niobate ($LiNbO_3$), lithium tantalate ($LiTaO_3$), or the like, for example.

In the present preferred embodiment, the upper electrode layer 123 is disposed on an upper side of the piezoelectric layer 122. The upper electrode layer 123 is disposed from a portion closer to the tip portion side than the end portion 121 of the beam portion 120 to the tip portion in the extending direction of the beam portion 120. Further, the upper electrode layer 123 is disposed over the entire or substantially the entire width direction perpendicular or substantially perpendicular to the extending direction of the beam portion 120 when the piezoelectric transducer 100 is viewed from above.

The upper electrode layer 123 is preferably made of a conductive material, such as Pt, for example. An adhesion layer made of Ti or the like, for example, may be disposed between the upper electrode layer 123 and the piezoelectric layer 122.

The lower electrode layer 124 faces at least a portion of the upper electrode layer 123 with the piezoelectric layer 122 interposed therebetween. In the present preferred embodiment, the lower electrode layer 124 is disposed over the entire or substantially the entire length from the end portion 121 side to the tip portion side of the beam portion 120 in the extending direction of the beam portion 120. Further, the lower electrode layer 124 is located over the entire or substantially the entire width direction orthogonal or substantially orthogonal to the extending direction of the beam portion 120.

The lower electrode layer 124 is preferably made of a conductive material, such as Pt, for example. An adhesion layer made of Ti or the like, for example, may be disposed between the lower electrode layer 124 and the base portion 110.

In the present preferred embodiment, each of the plurality of beam portions 120 further includes an active layer 125 on a lower side of the lower electrode layer 124. The active layer 125 is disposed over the entire or substantially the entire length from the end portion 121 side to the tip portion side of the beam portion 120 in the extending direction of the beam portion 120. Further, the active layer 125 is located over the entire or substantially the entire width direction perpendicular or substantially perpendicular to the extending direction of the beam portion 120.

In the present preferred embodiment, the active layer 125 is preferably made of Si, for example. The active layer 125 may be made of a material having an electrical insulation property. An adhesion layer made of Ti or the like, for example, may be disposed between the lower electrode layer 124 and the active layer 125.

As illustrated in FIG. 1 and FIG. 2, the fixing portion 130 is disposed on the beam portion 120 so as to sandwich the end portion 121 of each of the plurality of beam portions 120 between the fixing portion 130 and the base portion 110. The fixing portion 130 overlaps at least a portion of the base portion 110 in the up-down direction, and extends so as to protrude from the base portion 110 in the extending direction of the beam portion 120. The plurality of fixing portions 130 are spaced away from each other with the gap 101 interposed therebetween, and extends on an imaginary ring as viewed from the up-down direction.

In the present preferred embodiment, when the piezoelectric transducer 100 is viewed from above, an end surface of the fixing portion 130 located on the opposite side to the tip portion side of the beam portion 120 is preferably located closer to the tip portion side of the beam portion 120 than the end surface of the beam portion 120 located on the opposite side of the tip portion side of the beam portion 120, but may overlap the end surface of the beam portion 120.

In the present preferred embodiment, when the piezoelectric transducer 100 is viewed from above, a region in the beam portion 120 from a portion in which the end surface of the fixing portion 130 on the tip portion side of the beam portion 120 is located to the tip portion of the beam portion 120 is a movable portion 126.

In addition, in the present preferred embodiment, the fixing portion 130 is disposed on the piezoelectric layer 122. Further, when the piezoelectric transducer 100 is viewed from above, the fixing portion 130 does not overlap the upper electrode layer 123. The end surface of the fixing portion 130 on the tip portion side of the beam portion 120 and an end surface of the upper electrode layer 123 on the base portion 110 side are in contact with each other.

Note that the fixing portion 130 may be disposed on the upper electrode layer 123. In this case, it is possible to eliminate the need for alignment of the end surface of the fixing portion 130 on the tip portion side of the beam portion 120 and the end surface of the upper electrode layer 123 on the base portion 110 side.

In the present preferred embodiment, the fixing portion 130 is made of a material different from the material forming the upper electrode layer 123. The fixing portion 130 can be patterned without changing the shape of the upper electrode layer 123 by etching the fixing portion 130 using an etchant that does not react with the material forming the upper electrode layer 123.

Further, the material of the fixing portion 130 is harder than the material of the plurality of beam portions 120, and in the present preferred embodiment, the material of the fixing portion 130 has a higher Young's modulus than each of the material of the piezoelectric layer 122 and the material of the upper electrode layer 123. Specifically, the Young's modulus of the material of the fixing portion 130 is preferably equal to or greater than about 200 GPa, for example. The fixing portion 130 may be made of a metal material, or may be made of a non-metal material. However, in a case where the fixing portion 130 is in contact with the upper electrode layer 123 or the lower electrode layer 124, the fixing portion 130 is preferably made of a non-metal material.

As illustrated in FIG. 2, in the piezoelectric transducer 100 according to the present preferred embodiment, the base portion 110 and the beam portion 120 are formed by providing a recessed portion 102 from the lower surface side with respect to a multilayer body described later. Hereinafter, a non-limiting example of a method for manufacturing the piezoelectric transducer 100 according to Preferred Embodiment 1 of the present invention will be described.

Figure 3:
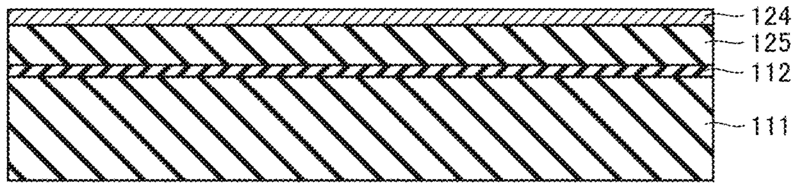
FIG. 3 is a sectional view illustrating a state in which a lower electrode layer is provided on an upper surface of an active layer in a method for manufacturing the piezoelectric transducer according to Preferred Embodiment 1 of the present invention.

FIG. 3 is a sectional view illustrating a state in which a lower electrode layer is provided on an upper surface of an active layer in the method for manufacturing the piezoelectric transducer according to Preferred Embodiment 1 of the present invention. As illustrated in FIG. 3, the lower electrode layer 124 is provided on the upper surface of the active layer 125 by a lift-off method, a plating method, an etching method, or the like, for example.

Note that in the present preferred embodiment, the multilayer body including the lower base portion 111, the upper base portion 112, and the active layer 125 is prepared in advance as a silicon on insulator (SOI) substrate, for example.

Figure 4:
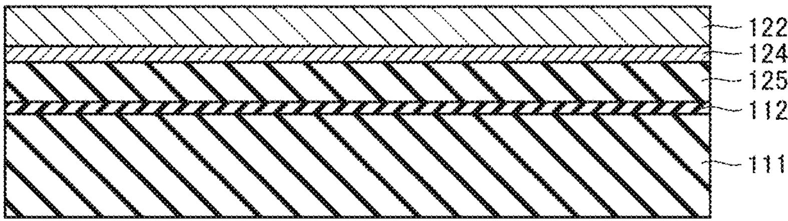
FIG. 4 is a sectional view illustrating a state in which a piezoelectric layer is provided on an upper surface of the lower electrode layer in the method for manufacturing the piezoelectric transducer according to Preferred Embodiment 1 of the present invention.

FIG. 4 is a sectional view illustrating a state in which a piezoelectric layer is provided on an upper surface of the lower electrode layer in the method for manufacturing the piezoelectric transducer according to Preferred Embodiment 1 of the present invention. As illustrated in FIG. 4, the piezoelectric layer 122 is provided on the upper surface of the lower electrode layer 124 by a chemical vapor deposition (CVD) method, a physical vapor deposition (PVD) method, or the like, for example.

Figure 5:
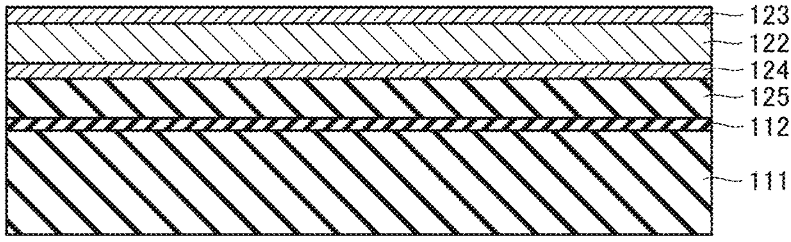
FIG. 5 is a sectional view illustrating a state in which an upper electrode layer is provided on an upper surface of the piezoelectric layer in the method for manufacturing the piezoelectric transducer according to Preferred Embodiment 1 of the present invention.
Figure 6:
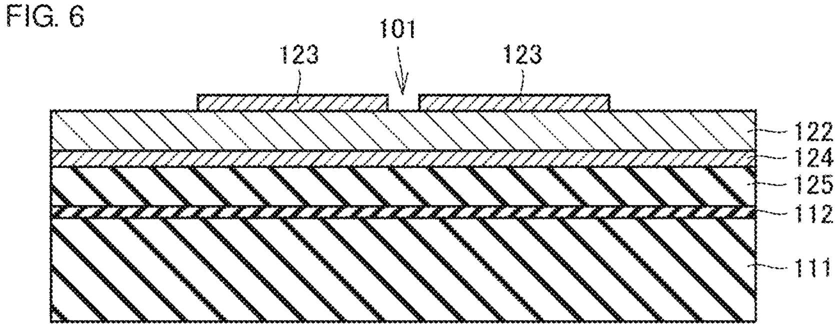
FIG. 6 is a diagram illustrating a state in which the upper electrode layer is patterned in the method for manufacturing the piezoelectric transducer according to Preferred Embodiment 1 of the present invention.

FIG. 5 is a sectional view illustrating a state in which an upper electrode layer is provided on an upper surface of the piezoelectric layer in the method for manufacturing the piezoelectric transducer according to Preferred Embodiment 1 of the present invention. FIG. 6 is a diagram illustrating a state in which the upper electrode layer is patterned in the method for manufacturing the piezoelectric transducer according to Preferred Embodiment 1 of the present invention.

As illustrated in FIG. 5 and FIG. 6, the upper electrode layer 123 is provided on the upper surface of the piezoelectric layer 122 by a lift-off method, a plating method, an etching method, or the like, for example, and the upper electrode layer 123 is patterned. Thus, the gap 101 is formed in the upper electrode layer 123.

Figure 7:
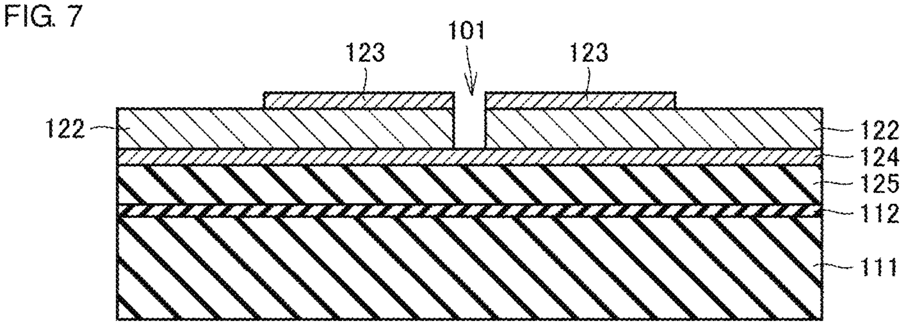
FIG. 7 is a diagram illustrating a state in which the piezoelectric layer is patterned in the method for manufacturing the piezoelectric transducer according to Preferred Embodiment 1 of the present invention.

FIG. 7 is a diagram illustrating a state in which the piezoelectric layer is patterned in the method for manufacturing the piezoelectric transducer according to Preferred Embodiment 1 of the present invention. As illustrated in FIG. 7, the piezoelectric layer 122 is patterned by a lift-off method, an etching method, or the like, for example. Thus, the gap 101 is formed in the piezoelectric layer 122.

Figure 8:
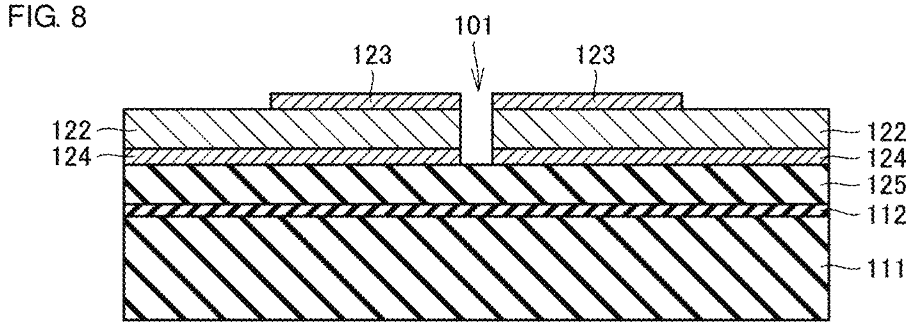
FIG. 8 is a diagram illustrating a state in which the lower electrode layer is patterned in the method for manufacturing the piezoelectric transducer according to Preferred Embodiment 1 of the present invention.

FIG. 8 is a diagram illustrating a state in which a lower electrode layer is patterned in the method for manufacturing the piezoelectric transducer according to Preferred Embodiment 1 of the present invention. As illustrated in FIG. 8, the lower electrode layer 124 is patterned by a lift-off method, an etching method, or the like, for example. Thus, the gap 101 is formed in the lower electrode layer 124.

Figure 9:
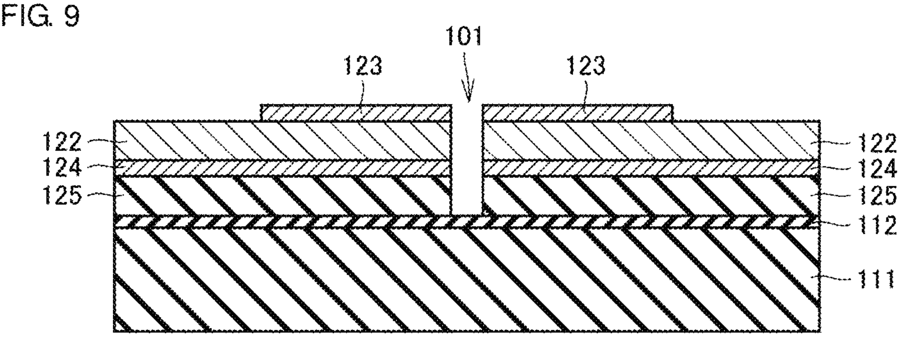
FIG. 9 is a diagram illustrating a state in which the active layer is patterned in the method for manufacturing the piezoelectric transducer according to Preferred Embodiment 1 of the present invention.

FIG. 9 is a diagram illustrating a state in which the active layer is patterned in the method for manufacturing the piezoelectric transducer according to Preferred Embodiment 1 of the present invention. As illustrated in FIG. 9, the active layer 125 is patterned by a lift-off method, an etching method, or the like, for example. Thus, the gap 101 is formed in the active layer 125.

Figure 10:
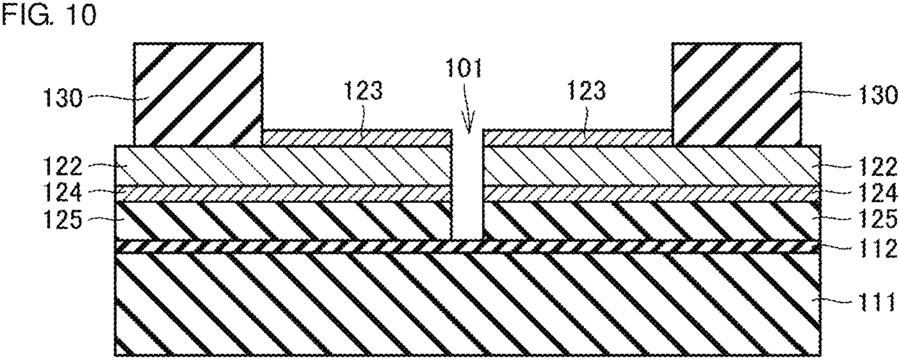
FIG. 10 is a diagram illustrating a state in which a fixing portion is provided on the upper surface of the piezoelectric layer in the method for manufacturing the piezoelectric transducer according to Preferred Embodiment 1 of the present invention.

FIG. 10 is a diagram illustrating a state in which a fixing portion is provided on the upper surface of the piezoelectric layer in the manufacturing method for the piezoelectric transducer according to Preferred Embodiment 1 of the present invention. As illustrated in FIG. 10, the fixing portion 130 is provided on the upper surface of the piezoelectric layer 122 by a lift-off method, a plating method, an etching method, or the like, for example.

Figure 11:
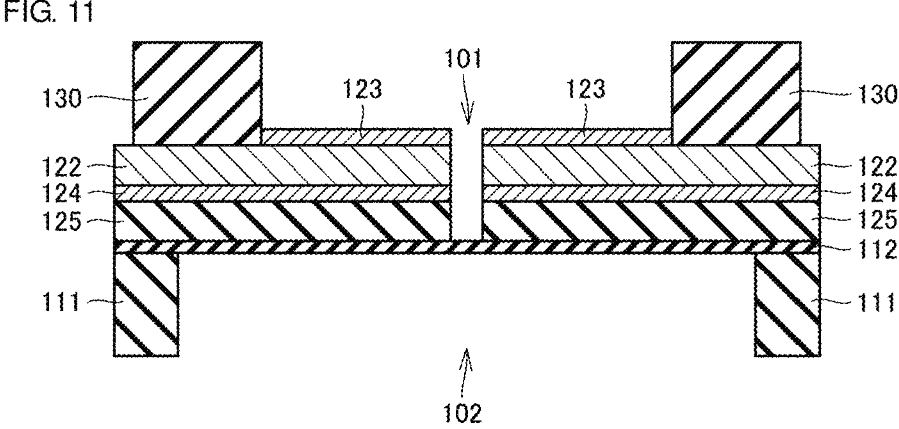
FIG. 11 is a diagram illustrating a state in which a recessed portion is formed in a lower base portion in the method for manufacturing the piezoelectric transducer according to Preferred Embodiment 1 of the present invention.

FIG. 11 is a diagram illustrating a state in which a recessed portion is formed in a lower base portion in the method for manufacturing the piezoelectric transducer according to Preferred Embodiment 1 of the present invention. As illustrated in FIG. 11, by performing deep reactive ion etching, wet etching, or the like, for example, on the lower base portion 111 from a lower surface side of the lower base portion 111, the recessed portion 102 is formed in the lower base portion 111.

Further, by performing deep reactive ion etching, wet etching, or the like, for example, on the upper base portion

112 from the lower surface side of the upper base portion 112, the recessed portion 102 is formed in the upper base portion 112. By these steps, the piezoelectric transducer 100 according to Preferred Embodiment 1 of the present invention as illustrated in FIG. 2 is manufactured.

FIG. 2 illustrates a state in which an alignment error between the processing to form the gap 101 and the processing to form the recessed portion 102 does not occur. As such, in FIG. 2, when viewed from the up-down direction of the piezoelectric transducer 100, extension lengths La of the plurality of beam portions 120 from an upper side of the base portion 110 are equal or substantially equal to each other, and lengths Lb of movable portions of the plurality of beam portions 120 are equal or substantially equal to each other.

In the piezoelectric transducer 100 according to the present preferred embodiment, it is possible to reduce or prevent the occurrence of a difference in the lengths of the movable portions of the plurality of beam portions 120 even in a case where a difference occurs in the extension lengths of the plurality of beam portions 120 from the upper side of the base portion 110 due to an alignment error between the processing for forming the gap 101 and the processing for forming the recessed portion 102.

Hereinafter, a description will be provided of a difference in effect of the above-described alignment error between the piezoelectric transducer according to Preferred Embodiment 1 of the present invention and a piezoelectric transducer according to a comparative example, which is different from the piezoelectric transducer according to Preferred Embodiment 1 of the present invention only in that the fixing portion 130 is not provided.

Figure 12:
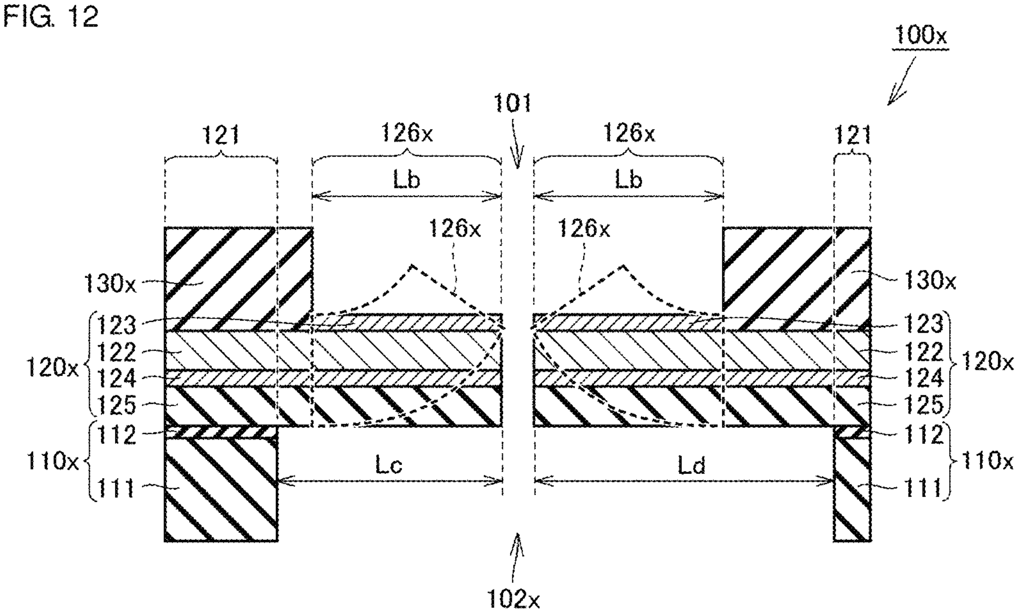
FIG. 12 is a sectional view of a piezoelectric transducer according to an example of a preferred embodiment of the present invention.

FIG. 12 is a sectional view of a piezoelectric transducer according to an example of a preferred embodiment of the present invention. The sectional view of a piezoelectric transducer 100*x* in FIG. 12 illustrates the same sectional view as the sectional view of the piezoelectric transducer 100 illustrated in FIG. 2.

As illustrated in FIG. 12, in the piezoelectric transducer 100*x* according to the example, since an alignment error occurs between the processing for forming the gap 101 and the processing for forming the recessed portion 102*x*, the extension lengths of the plurality of beam portions 120*x* from upper side of the base portion 110*x* are different from each other. For example, among the plurality of beam portions 120*x*, an extension length of one beam portion 120*x* from the upper side of the base portion 110*x* is Lc, an extension length of another one of the beam portions 120*x* from the upper side of the base portion 110*x* is Ld, and Lc<Ld.

The piezoelectric transducer 100*x* according to the example includes a fixing portion 130*x*. The fixing portion 130*x* overlaps at least a portion of the base portion 110*x* in the up-down direction, and extends so as to protrude from the base portion 110*x* in an extending direction of the beam portion 120*x*. As illustrated in FIG. 12, since a portion in which the fixing portion 130*x* is provided in each of the plurality of beam portions 120*x* is fixed by the fixing portion 130*x*, a position of an end surface of the fixing portion 130*x* on a tip portion side of the beam portion 120*x* is a fixed end of a movable portion 126*x*.

In the processing for forming the fixing portion 130*x*, since the alignment is performed, similarly to the processing for forming the gap 101, from a front surface side of the piezoelectric transducer 100*x*, the alignment error is less likely to occur as compared to a case of using a double-sided aligner in the processing for forming the recessed portion 102*x*. As such, it is possible to reduce or prevent variation in the formation position of the fixing portion 130*x* due to the alignment error. As a result, even in a case where the extension lengths of the plurality of beam portions 120*x* from the upper side of the base portion 110*x* are different from each other, the lengths Lb of movable portions of the plurality of beam portions 120*x* can be maintained equal or substantially equal to each other.

Accordingly, as illustrated in FIG. 12, when the piezoelectric transducer 100*x* according to the example is driven, it is possible to uniformly or substantially uniformly deform the movable portions 126*x* of the plurality of beam portions 120*x*, as indicated by a region surrounded by a dotted line.

Figure 13:
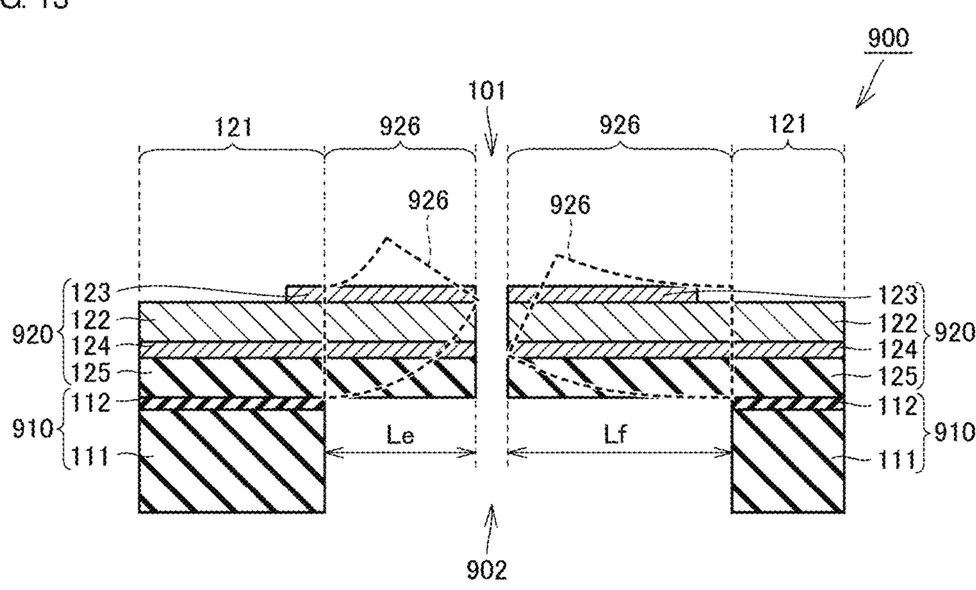
FIG. 13 is a sectional view of a piezoelectric transducer according to a comparative example.

FIG. 13 is a sectional view of a piezoelectric transducer according to a comparative example. The sectional view of a piezoelectric transducer 900 in FIG. 13 illustrates the same sectional view as the sectional view of the piezoelectric transducer 100 illustrated in FIG. 2.

As illustrated in FIG. 13, in the piezoelectric transducer 900 according to the comparative example, since an alignment error occurs between the processing for forming the gap 101 and the processing for forming a recessed portion 902, extension lengths of a plurality of beam portions 920 from upper side of base portion 910 are different from each other. For example, among the plurality of beam portions 920, an extension length of one beam portion 920 from the upper side of the base portion 910 is Le, an extension length of another one of the beam portions 920 from the upper side of the base portion 910 is Lf, and Le<Lf.

In the piezoelectric transducer 900 according to the comparative example, the entire portion of each of the beam portions 920 that extend from the upper side of the base portion 910 is a movable portion 926. Thus, a position of an end surface of the base portion 910 on a tip portion side of the beam portion 920 is a fixed end of the movable portion 926. As a result, lengths of the plurality of movable portions 926 are different from each other. Therefore, the length of the movable portion 926 of the above-described one beam portion 920 is Le, the length of the movable portion 926 of another one of the beam portions 920 is Lf, and Le<Lf.

Accordingly, as illustrated in FIG. 13, when the piezoelectric transducer 900 according to the comparative example is driven, as indicated by a region surrounded by a dotted line, the movable portions 926 of the plurality of beam portions 920 are not uniformly deformed.

As described above, in the piezoelectric transducer 100 according to Preferred Embodiment 1 of the present invention, the fixing portion 130 is disposed on the beam portion 120 so as to sandwich the end portion 121 of each of the plurality of beam portions 120 between the fixing portion 130 and the base portion 110. The fixing portion 130 overlaps at least a portion of the base portion 110 in the up-down direction, and extends so as to protrude from the base portion 110 in the extending direction of the beam portion 120.

By equalizing the lengths of the movable portions 126 of the plurality of beam portions 120, mechanical characteristics, such as a resonant frequency and a deformation amount of the plurality of beam portions 120, are made uniform or substantially uniform, and it is possible to improve input/output characteristics of the piezoelectric transducer 100.

In the piezoelectric transducer 100 according to the present preferred embodiment, the fixing portion 130 is disposed on the piezoelectric layer 122.

Accordingly, since the piezoelectric layer 122 sandwiched between the upper electrode layer 123 and the lower electrode layer 124 is not located under the fixing portion 130, the end portion 121 of each of the plurality of beam portions 120 can be stably fixed by the fixing portion 130. As a result, it is possible to stably improve the input/output characteristics of the piezoelectric transducer 100.

In the piezoelectric transducer 100 according to the present preferred embodiment, the material of the fixing portion 130 has a higher Young's modulus than each of the material of the piezoelectric layer 122 and the material of the upper electrode layer 123.

Accordingly, at the time of driving the piezoelectric transducer 100, when the movable portion 126 of the beam portion 120 is displaced, the end portion 121 of the beam portion 120 can be more firmly fixed by the fixing portion 130.

Next, a piezoelectric transducer according to a modified example of Preferred Embodiment 1 of the present invention will be described with reference to the drawings. Note that the piezoelectric transducer according to the modified example of Preferred Embodiment 1 of the present invention differs from the piezoelectric transducer 100 according to Preferred Embodiment 1 of the present invention mainly in that a plate-shaped portion is included, and each of the plurality of beam portions has a rectangular or substantially rectangular shape and does not extend toward the imaginary center point C. Therefore, a description will not be repeated for the same or corresponding configuration as that of the piezoelectric transducer 100 according to Preferred Embodiment 1 of the present invention.

Figure 14:
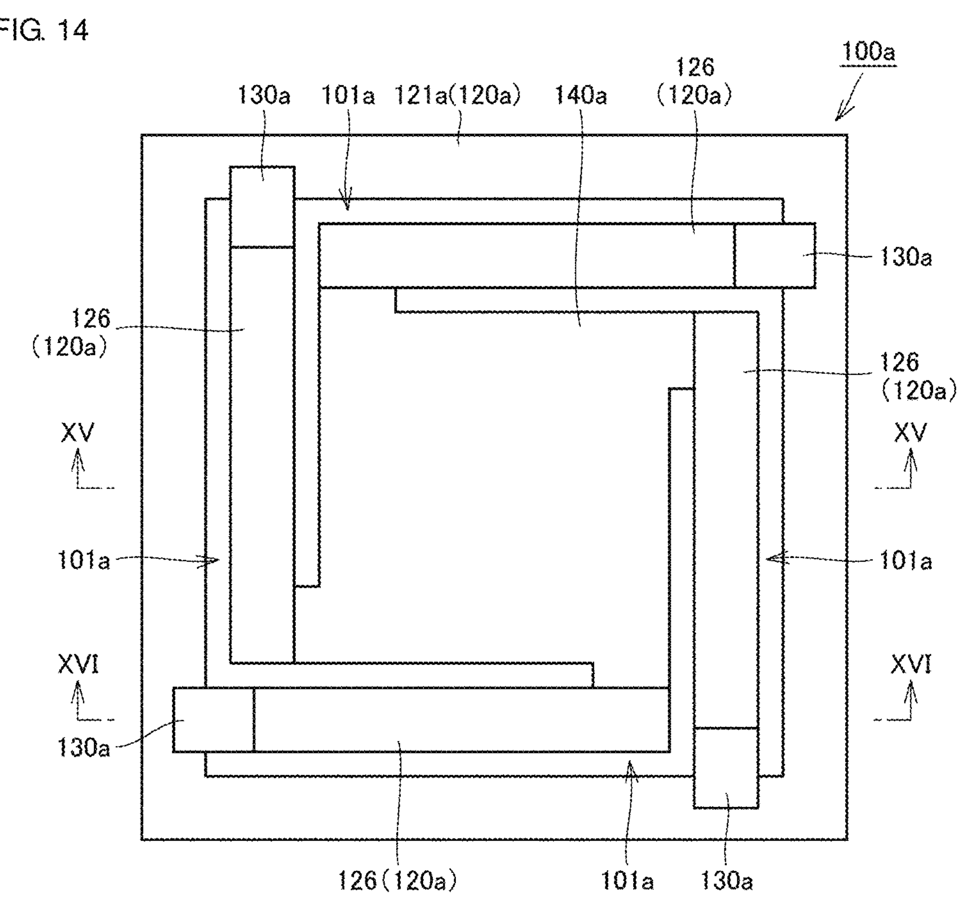
FIG. 14 is a plan view illustrating a configuration of a piezoelectric transducer according to a modified example of Preferred Embodiment 1 of the present invention.
Figure 15:
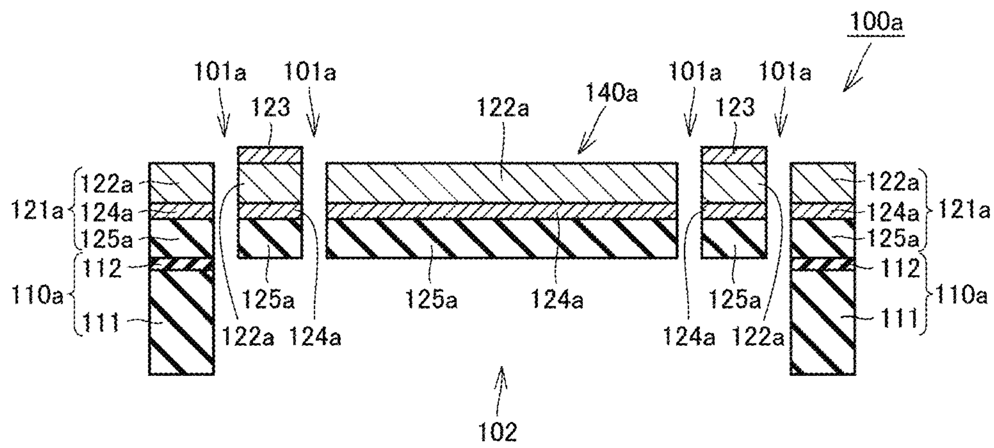
FIG. 15 is a sectional view of the piezoelectric transducer illustrated in FIG. 14 taken along line XV-XV and viewed from a direction denoted by arrow.
Figure 16:
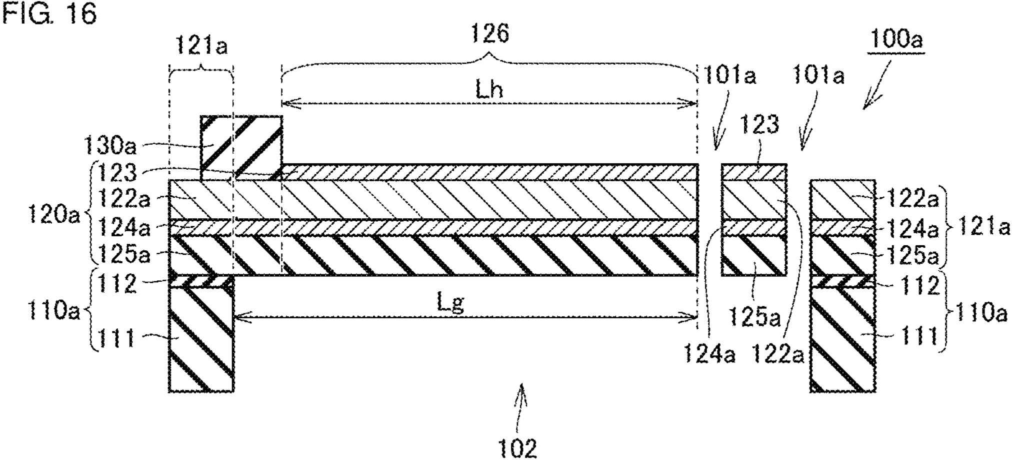
FIG. 16 is a sectional view of the piezoelectric transducer illustrated in FIG. 14 taken along line XVI-XVI and viewed from a direction denoted by arrow.

FIG. 14 is a plan view illustrating the configuration of the piezoelectric transducer according to the modified example of Preferred Embodiment 1 of the present invention. FIG. 15 is a sectional view of the piezoelectric transducer illustrated in FIG. 14 taken along line XV-XV and viewed from a direction indicated by arrow. FIG. 16 is a sectional view of the piezoelectric transducer illustrated in FIG. 14 taken long line XVI-XVI and viewed from a direction indicated by arrow.

As illustrated in FIG. 14 to FIG. 16, a piezoelectric transducer 100*a* according to the modified example of Preferred Embodiment 1 of the present invention includes a base portion 110*a*, a plurality of beam portions 120*a*, a fixing portion 130*a*, and a plate-shaped portion 140*a*.

As illustrated in FIG. 14, each of the plurality of beam portions 120*a* has an outer shape in which a width in the extending direction is constant or substantially constant when the piezoelectric transducer 100*a* is viewed from above. Specifically, each of the plurality of beam portions 120*a* has a rectangular or substantially rectangular outer shape when the piezoelectric transducer 100*a* is viewed from above.

The piezoelectric transducer 100*a* according to the modified example of Preferred Embodiment 1 includes four beam portions 120*a*. As illustrated in FIG. 14 and FIG. 16, when the piezoelectric transducer 100*a* is viewed from above, on an inner side of the base portion 110*a* having a rectangular or substantially rectangular annular outer shape, each of the four beam portions 120*a* extends along a corresponding side of a plurality of sides of the rectangular or substantially rectangular annular shape. Each of the plurality of beam portions 120*a* extends while being spaced from the base portion 110*a* by a gap 101*a* having a constant or substantially constant width. Each of the plurality of beam portions 120*a* is located such that a tip portion of the beam portion 120*a* is spaced apart from an adjacent beam portion 120*a* by the gap 101*a* having a constant or substantially constant width.

As illustrated in FIG. 14, in the piezoelectric transducer 100*a* according to the modified example of Preferred Embodiment 1, the tip portion on the side opposite to the base portion 110*a* side of each of the plurality of beam portions 120*a* is connected to the plate-shaped portion 140*a*.

In the modified example of Preferred Embodiment 1, when the piezoelectric transducer 100*a* is viewed from above, the plate-shaped portion 140*a* is located on an inner side of the plurality of beam portions 120*a*. The plate-shaped portion 140*a* has a rectangular or substantially rectangular outer shape. The plate-shaped portion 140*a* is connected to the beam portion 120*a* at an apex of the rectangular or substantially rectangular shape.

As illustrated in FIG. 15, in the modified example of Preferred Embodiment 1, the plate-shaped portion 140*a* includes a piezoelectric layer 122*a*, a lower electrode layer 124*a*, and an active layer 125*a*, similar to an end portion 121*a* of the beam portion 120*a*. The lower electrode layer 124*a* is disposed on a lower side of the piezoelectric layer 122*a*. The active layer 125*a* is disposed on a lower side of the lower electrode layer 124*a*.

In the modified example of Preferred Embodiment 1, the piezoelectric layer 122*a* included in the plate-shaped portion 140*a* is continuous with the piezoelectric layer 122*a* included in each of the plurality of beam portions 120*a*. The lower electrode layer 124*a* included in the plate-shaped portion 140*a* is continuous with the lower electrode layer 124*a* included in each of the plurality of beam portions 120*a*. The active layer 125*a* included in the plate-shaped portion 140*a* is continuous with the active layer 125*a* included in each of the plurality of beam portions 120*a*. As described above, the plate-shaped portion 140*a* is continuous with each of the plurality of beam portions 120*a*.

The plate-shaped portion 140*a* vibrates up and down together with the movable portion 126 of the beam portion 120*a* that displaces up and down when the piezoelectric transducer 100*a* is driven. Note that, as illustrated in FIG. 16, also in the piezoelectric transducer 100*a* according to the modified example of Preferred Embodiment 1, the fixing portion 130*a* is disposed on the beam portion 120*a* so as to sandwich the end portion 121*a* of each of the plurality of beam portions 120*a* between the fixing portion 130*a* and the base portion 110*a*. The fixing portion 130*a* overlaps at least a portion of the base portion 110*a* in the up-down direction, and extends so as to protrude from the base portion 110*a* in an extending direction of the beam portion 120*a*.

An extension length of each of the plurality of beam portions 120*a* from the upper side of the base portion 110*a* is Lg, and the length of the movable portion 126 of each of the plurality of beam portions 120*a* is Lh.

Also in the piezoelectric transducer 100*a* according to the modified example of Preferred Embodiment 1, even in a case where a difference occurs in the extension lengths Lg of the plurality of beam portions 120*a* from the upper side of the base portion 110*a* due to an alignment error between the processing for forming the gap 101*a* and the processing for forming the recessed portion 102, it is possible to reduce or prevent the occurrence of a difference in the lengths Lh of the movable portions 126 of the plurality of beam portions 120*a*.

By equalizing the lengths Lh of the movable portions 126 of the plurality of beam portions 120*a*, mechanical characteristics, such as a resonant frequency and a deformation amount of the plurality of beam portions 120*a*, are made uniform or substantially uniform, and it is possible to improve input/output characteristics of the piezoelectric transducer 100*a*.

Preferred Embodiment 2

Hereinafter, a piezoelectric transducer according to Preferred Embodiment 2 of the present invention will be described. The piezoelectric transducer according to Preferred Embodiment 2 of the present invention differs from the piezoelectric transducer 100 according to Preferred Embodiment 1 in the configuration of the fixing portion. Therefore, the description of the same or similar configuration as that of the piezoelectric transducer 100 according to Preferred Embodiment 1 of the present invention will not be repeated.

Figure 17:
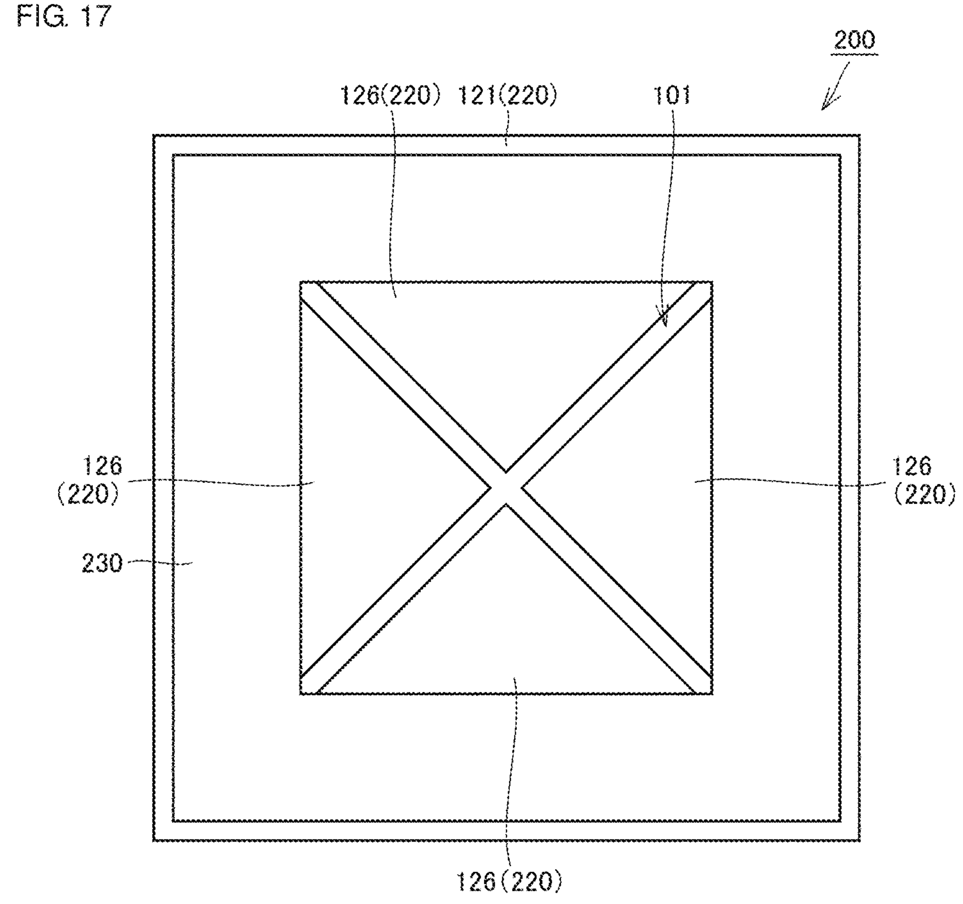
FIG. 17 is a plan view illustrating a configuration of a piezoelectric transducer according to Preferred Embodiment 2 of the present invention.

FIG. 17 is a plan view illustrating the configuration of the piezoelectric transducer according to Preferred Embodiment 2 of the present invention. As illustrated in FIG. 17, a fixing portion 230 on each of a plurality of beam portions 220 is defined by a single member so as to be continuous, and has an annular shape when viewed from the up-down direction. Accordingly, the end portion 121 of each of the plurality of beam portions 220 can stably and more firmly be fixed by the fixing portion 230. As a result, it is possible to stably improve the input/output characteristics of a piezoelectric transducer 200.

Preferred Embodiment 3

Hereinafter, a piezoelectric transducer according to Preferred Embodiment 3 of the present invention will be described. The piezoelectric transducer according to Preferred Embodiment 3 of the present invention differs from the piezoelectric transducer 100 according to Preferred Embodiment 1 of the present invention in the position at which the fixing portion is disposed. Therefore, the description of the same or similar configuration as that of the piezoelectric transducer 100 according to Preferred Embodiment 1 of the present invention will not be repeated.

FIG. 18 is a sectional view illustrating the configuration of the piezoelectric transducer according to Preferred Embodiment 3 of the present invention. The sectional view of a piezoelectric transducer 300 in FIG. 18 illustrates the same sectional view as the sectional view of the piezoelectric transducer 100 illustrated in FIG. 2.

As illustrated in FIG. 18, in the piezoelectric transducer 300 according to Preferred Embodiment 3 of the present invention, a piezoelectric layer 322 is located from a position closer to a tip portion side of a beam portion 320 than an end portion 321 to the tip portion of the beam portion 320 in an extending direction of the beam portion 320. That is, the piezoelectric layer 322 is not disposed above a base portion 310.

Further, in the piezoelectric transducer 300 according to the present preferred embodiment, a fixing portion 330 is disposed on a lower electrode layer 324. An end surface of the fixing portion 330 on a tip portion side of the beam portion 320 and an end surface of the piezoelectric layer 322 on the end portion 321 side are in contact with each other.

Hereinafter, a non-limiting example of a method for manufacturing the piezoelectric transducer 300 according to Preferred Embodiment 3 of the present invention will be described.

FIG. 19 is a sectional view illustrating a state in which a lower electrode layer is provided on an upper surface of an active layer in the method for manufacturing the piezoelectric transducer according to Preferred Embodiment 3 of the present invention. As illustrated in FIG. 19, the lower electrode layer 324 is provided on an upper surface of an active layer 325 by a lift-off method, a plating method, an etching method, or the like, for example. Note that in the present preferred embodiment, a multilayer body including a lower base portion 311, an upper base portion 312, and the active layer 325 is prepared in advance as a SOI substrate.

FIG. 20 is a sectional view illustrating a state in which a fixing portion is provided on an upper surface of the lower electrode layer in the method for manufacturing the piezoelectric transducer according to Preferred Embodiment 3 of the present invention. As illustrated in FIG. 20, the fixing portion 330 is provided on an upper surface of the lower electrode layer 324 by a lift-off method, a plating method, an etching method, or the like, for example.

Figure 21:
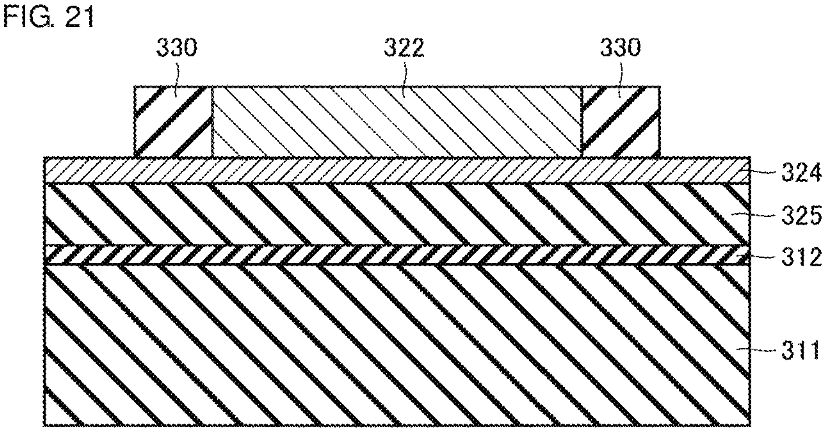
FIG. 21 is a sectional view illustrating a state in which a piezoelectric layer is provided on an upper surface of the lower electrode layer in the method for manufacturing the piezoelectric transducer according to Preferred Embodiment 3 of the present invention.

FIG. 21 is a sectional view illustrating a state in which a piezoelectric layer is provided on the upper surface of the lower electrode layer in the method for manufacturing the piezoelectric transducer according to Preferred Embodiment 3 of the present invention. As illustrated in FIG. 21, the piezoelectric layer 322 is provided on the upper surface of the lower electrode layer 324 by a CVD method, a PVD method, or the like, for example.

Figure 22:
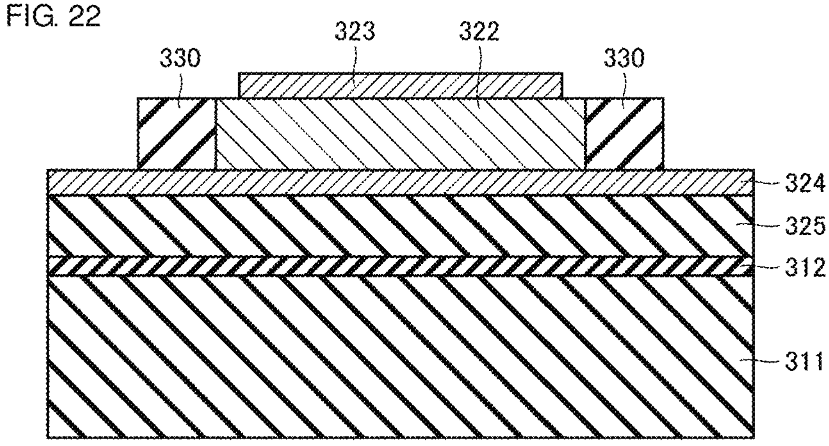
FIG. 22 is a sectional view illustrating a state in which an upper electrode layer is provided on an upper surface of a piezoelectric layer in the method for manufacturing the piezoelectric transducer according to Preferred Embodiment 3 of the present invention.
Figure 23:
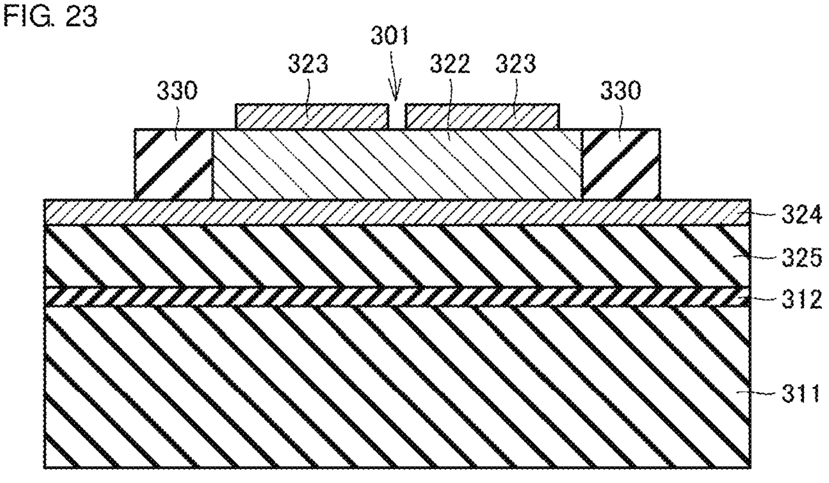
FIG. 23 is a diagram illustrating a state in which the upper electrode layer is patterned in the method for manufacturing the piezoelectric transducer according to Preferred Embodiment 3 of the present invention.

FIG. 22 is a sectional view illustrating a state in which an upper electrode layer is provided on an upper surface of the piezoelectric layer in the method for manufacturing the piezoelectric transducer according to Preferred Embodiment 3 of the present invention. FIG. 23 is a diagram illustrating a state in which the upper electrode layer is patterned in the method for manufacturing the piezoelectric transducer according to Preferred Embodiment 3 of the present invention.

As illustrated in FIG. 22 and FIG. 23, an upper electrode layer 323 is provided on an upper surface of the piezoelectric layer 322 by a lift-off method, a plating method, an etching method, or the like, for example, and a gap 301 is formed in the upper electrode layer 323.

Figure 24:
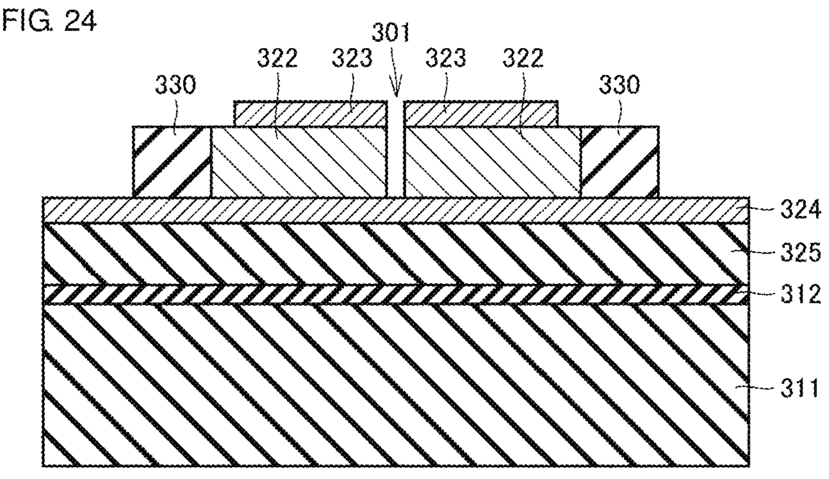
FIG. 24 is a diagram illustrating a state in which the piezoelectric layer is patterned in the method for manufacturing the piezoelectric transducer according to Preferred Embodiment 3 of the present invention.

FIG. 24 is a diagram illustrating a state in which the piezoelectric layer is patterned in the method for manufacturing the piezoelectric transducer according to Preferred Embodiment 3 of the present invention. As illustrated in FIG. 24, the piezoelectric layer 322 is patterned by a lift-off method, an etching method, or the like, for example. Thus, the gap 301 is formed in the piezoelectric layer 322.

Figure 25:
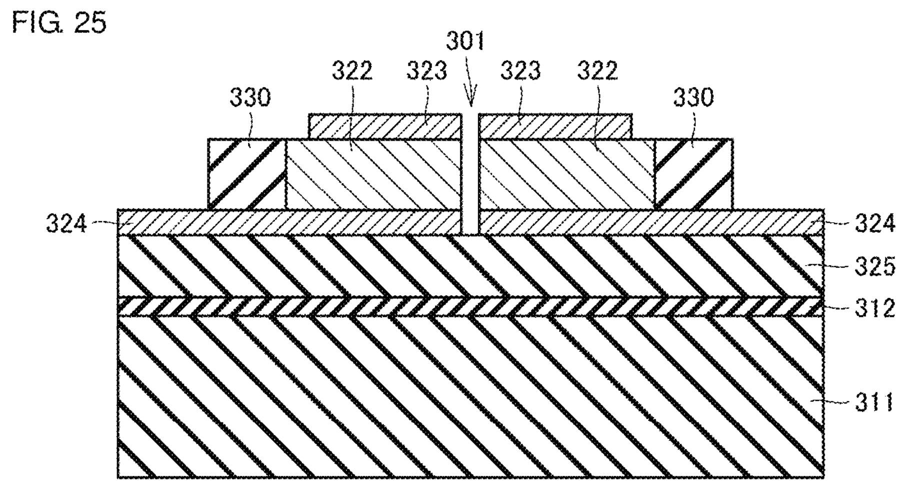
FIG. 25 is a diagram illustrating a state in which the lower electrode layer is patterned in the method for manufacturing the piezoelectric transducer according to Preferred Embodiment 3 of the present invention.

FIG. 25 is a diagram illustrating a state in which the lower electrode layer is patterned in the method for manufacturing the piezoelectric transducer according to Preferred Embodiment 3 of the present invention. As illustrated in FIG. 25, the lower electrode layer 324 is patterned by a lift-off method, an etching method, or the like, for example. Thus, the gap 301 is formed in the lower electrode layer 324.

Figure 26:
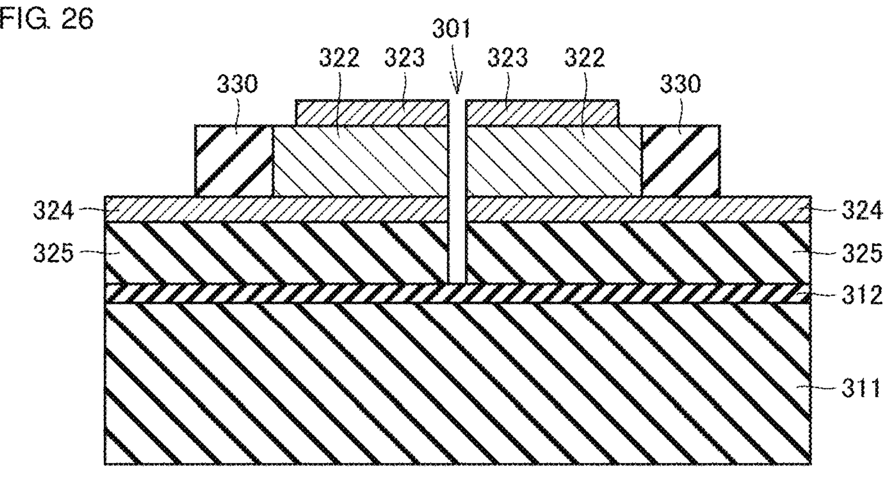
FIG. 26 is a diagram illustrating a state in which the active layer is patterned in the method for manufacturing the piezoelectric transducer according to Preferred Embodiment 3 of the present invention.

FIG. 26 is a diagram illustrating a state in which the active layer is patterned in the method for manufacturing the piezoelectric transducer according to Preferred Embodiment 3 of the present invention. As illustrated in FIG. 26, the active layer 325 is patterned by a lift-off method, an etching method, or the like, for example. Thus, the gap 301 is formed in the active layer 325.

Figure 27:
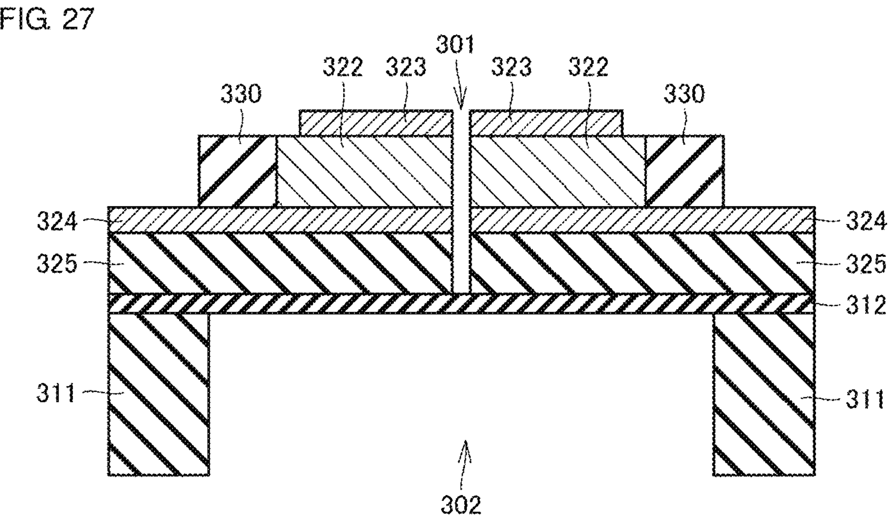
FIG. 27 is a diagram illustrating a state in which a recessed portion is formed in a lower base portion in the method for manufacturing the piezoelectric transducer according to Preferred Embodiment 3 of the present invention.

FIG. 27 is a diagram illustrating a state in which a recessed portion is formed in a lower base portion in the method for manufacturing the piezoelectric transducer according to Preferred Embodiment 3 of the present invention. As illustrated in FIG. 27, by performing deep reactive ion etching, wet etching, or the like, for example, on the lower base portion 311 from a lower surface side of the lower base portion 311, a recessed portion 302 is formed in the lower base portion 311.

Further, by performing the deep reactive ion etching, the wet etching, or the like, for example, on the upper base portion 312 from a lower surface side of the upper base portion 312, the recessed portion 302 is formed in the upper base portion 312. By these steps, the piezoelectric transducer 300 according to Preferred Embodiment 3 of the present invention as illustrated in FIG. 18 is manufactured.

As described above, in the piezoelectric transducer 300 according to the present preferred embodiment, the fixing portion 330 is disposed on the lower electrode layer 324. Thus, since the piezoelectric layer 322 is not located below the fixing portion 330, the end portion 321 of each of the plurality of beam portions 320 can stably be fixed by the fixing portion 330. As a result, it is possible to stably improve the input/output characteristics of the piezoelectric transducer 300.

Also in the piezoelectric transducer 300 according to the present preferred embodiment, even in a case where a difference occurs in extension lengths Li of the plurality of beam portions 320 from an upper side of the base portion 310 due to an alignment error between the processing for forming the gap 301 and the processing for forming the recessed portion 302, it is possible to reduce or prevent the occurrence of a difference in lengths Lj of the movable portions 126 of the plurality of beam portions 320.

By equalizing the lengths Lj of the movable portions 126 of the plurality of beam portions 320, mechanical characteristics, such as a resonant frequency and a deformation amount of the plurality of beam portions 320, are made uniform or substantially uniform, and the input/output characteristics of the piezoelectric transducer 300 can be improved.

Preferred Embodiment 4

Hereinafter, a piezoelectric transducer according to Preferred Embodiment 4 of the present invention will be described. The piezoelectric transducer according to Preferred Embodiment 4 of the present invention differs from the piezoelectric transducer 100 according to Preferred Embodiment 1 in the shape of the movable portion in each of the plurality of beam portions. Therefore, the description of the same or similar configuration as that of the piezoelectric transducer 100 according to Preferred Embodiment 1 of the present invention will not be repeated.

Figure 28:
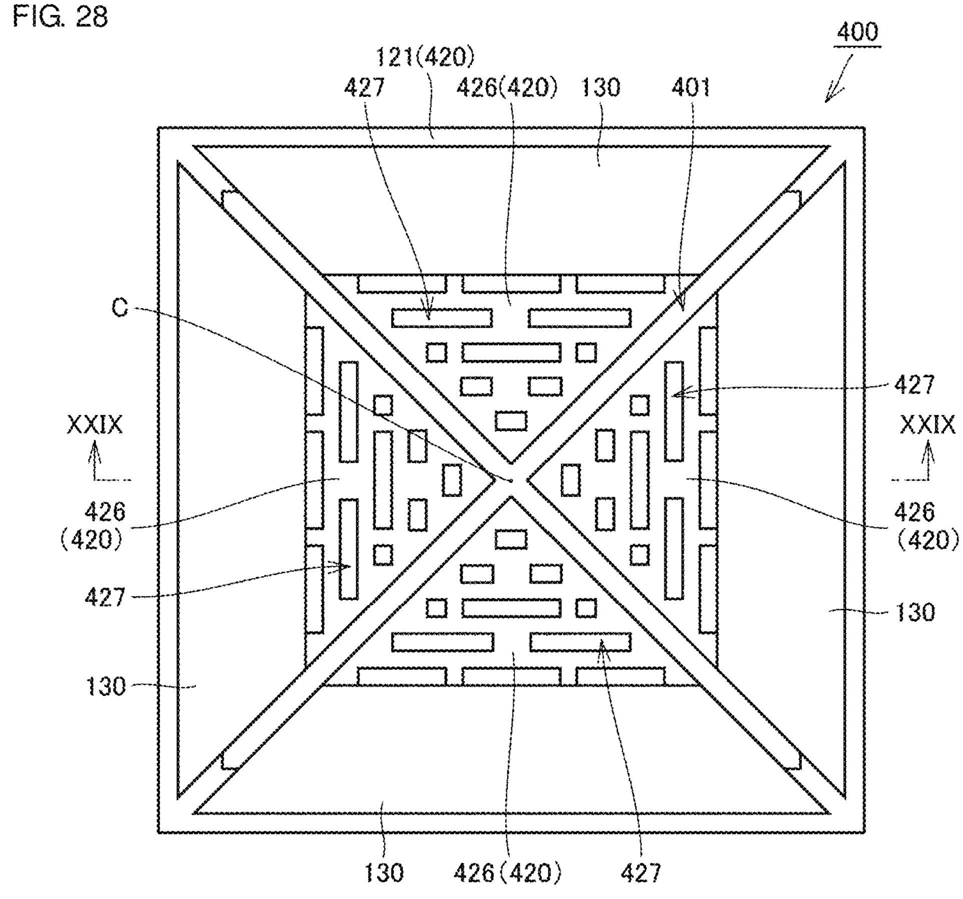
FIG. 28 is a plan view illustrating a configuration of a piezoelectric transducer according to Preferred Embodiment 4 of the present invention.
Figure 29:
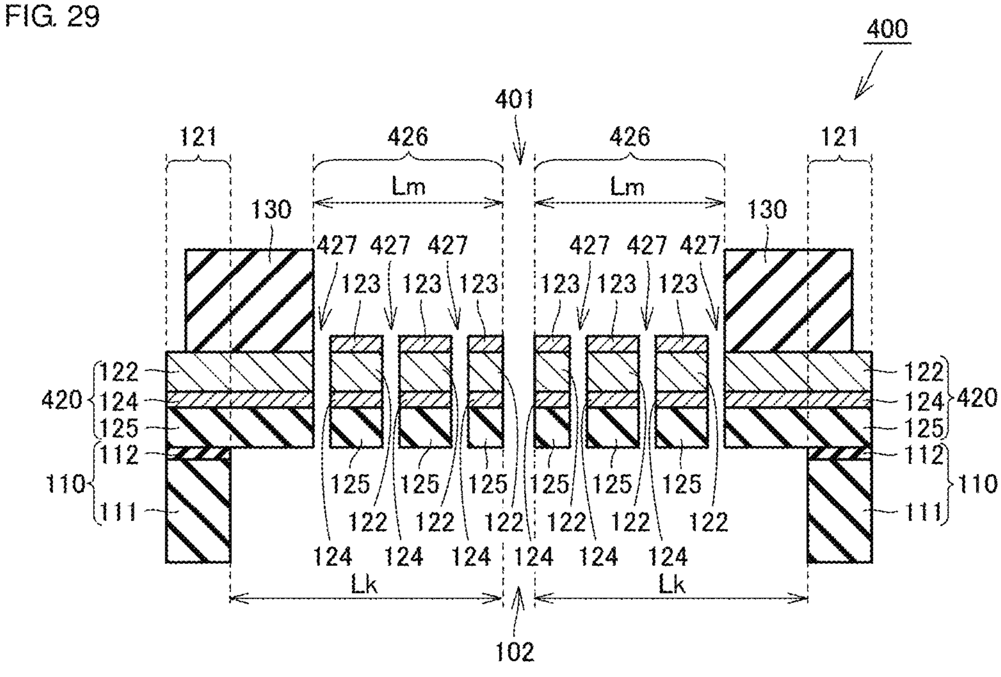
FIG. 29 is a sectional view of the piezoelectric transducer illustrated in FIG. 28 taken along line XXIX-XXIX and viewed from a direction denoted by arrow.

FIG. 28 is a plan view illustrating the configuration of the piezoelectric transducer according to Preferred Embodiment 4 of the present invention. FIG. 29 is a sectional view of the piezoelectric transducer illustrated in FIG. 28 taken along line XXIX-XXIX and viewed from a direction indicated by arrow.

As illustrated in FIG. 28 and FIG. 29, in a piezoelectric transducer 400 according to Preferred Embodiment 4 of the present invention, a plurality of through-holes 427 penetrating through a beam portion 420 in an up-down direction are provided in each of the plurality of beam portions 420. Each of the plurality of through-holes 427 is located closer to a tip portion side of the beam portion 420 than a fixing portion 430 in an extending direction of the beam portion 420.

That is, each of the plurality of through-holes 427 is located in a movable portion 426 of the beam portion 420. Accordingly, in each of the plurality of beam portions 420, the rigidity of the movable portion 426 is reduced, and an end portion 421 of each of the plurality of beam portions 420 can be stably fixed by the fixing portion 430. As a result, it is possible to stably improve the input/output characteristics of the piezoelectric transducer 400.

The plurality of through-holes 427 are disposed so as to be symmetric with respect to the extending direction of the beam portion 420 in each of the plurality of beam portions 420. The plurality of through-holes 427 in each of the plurality of beam portions 420 are disposed such that shapes of the plurality of beam portions 420 are point-symmetric to each other with respect to the imaginary center point C of the piezoelectric transducer 400.

In the present preferred embodiment, the plurality of through-holes 427 are formed in processing for patterning a gap 401, for example. However, the method for forming the plurality of through-holes 427 is not limited to the above-described method, and the plurality of through-holes 427 may be formed by processing, such as perforating, for example, different from the processing for patterning the gap 401.

Also in the piezoelectric transducer 400 according to the present preferred embodiment, even in a case where a difference occurs in extension lengths Lk of the plurality of beam portions 420 from an upper side of a base portion 410 due to an alignment error between the processing for forming the gap 401 and the processing for forming the recessed portion 102, it is possible to reduce or prevent the occurrence of a difference in lengths Lm of the movable portions 426 of the plurality of beam portions 420.

By equalizing the lengths Lm of the movable portions 426 of the plurality of beam portions 420, mechanical characteristics, such as a resonant frequency and a deformation amount of the plurality of beam portions 420, are made uniform or substantially uniform, and it is possible to improve input/output characteristics of the piezoelectric transducer 400.

In the description of the above-described preferred embodiments, configurations able to be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric transducer comprising:

a base portion;

a plurality of beam portions each of which includes a plurality of layers, is supported by the base portion at an end portion, and extends in a direction away from the base portion at a position above the base portion; and at least one fixing portion disposed on the plurality of beam portions so as to sandwich the end portion of each of the beam portions between the at least one fixing portion and the base portion; wherein each of the plurality of beam portions includes a piezoelectric layer, an upper electrode layer on an upper side of the piezoelectric layer, and a lower electrode layer facing at least a portion of the upper electrode layer with the piezoelectric layer interposed between the upper electrode layer and the lower electrode layer;

the at least one fixing portion overlaps at least a portion of the base portion in an up-down direction, and protrudes from the base portion in an extending direction of at least one of the beam portions;

the plurality of the beam portions are spaced away from each other with a gap interposed therebetween;

the gap extends radially and continuously from a center portion of the piezoelectric transducer to the at least one fixing portion;

the at least one fixing portion that overlaps the portion of the base portion in the up-down direction and protrudes from the base portion in the extending direction is disposed directly on the piezoelectric layer; and the at least one fixing portion does not overlap with the upper electrode when viewed in the up-down direction.

2. A piezoelectric transducer comprising:

a base portion;

a plurality of beam portions each of which includes a plurality of layers, is supported by the base portion at an end portion, and extends in a direction away from the base portion at a position above the base portion; and at least one fixing portion disposed on the plurality of beam portions so as to sandwich the end portion of each of the beam portions between the at least one fixing portion and the base portion; wherein each of the plurality of beam portions includes a piezoelectric layer, an upper electrode layer on an upper side of the piezoelectric layer, and a lower electrode layer facing at least a portion of the upper electrode layer with the piezoelectric layer interposed between the upper electrode layer and the lower electrode layer;

the at least one fixing portion overlaps at least a portion of the base portion in an up-down direction, and protrudes from the base portion in an extending direction of at least one of the beam portions;

the plurality of the beam portions are spaced away from each other with a gap interposed therebetween;

the gap extends radially and continuously from a center portion of the piezoelectric transducer to the at least one fixing portion;

the at least one fixing portion that overlaps the portion of the base portion in the up-down direction and protrudes from the base portion in the extending direction is disposed directly on the lower electrode layer; and the at least one fixing portion does not overlap with the upper electrode when viewed in the up-down direction.

3. The piezoelectric transducer according to claim 1, wherein the at least one fixing portion located on each of the plurality of beam portions is defined by a single fixing portion so as to be continuous, and has an annular shape when viewed in the up-down direction.

4. The piezoelectric transducer according to claim 1, wherein a material of the at least one fixing portion has a Young's modulus higher than a Young's modulus of each of a material of the piezoelectric layer and a material of the upper electrode layer.

5. The piezoelectric transducer according to claim 1, wherein the base portion has an annular outer shape when viewed in the up-down direction.

6. The piezoelectric transducer according to claim 1, wherein the base portion has a constant or substantially constant width in the up-down direction.

7. The piezoelectric transducer according to claim 1, wherein the base portion includes a lower base portion and an upper base portion on the lower base portion.

8. The piezoelectric transducer according to claim 7, wherein the lower base portion is made of Si, and the upper base portion is made of $SiO_2$.

9. The piezoelectric transducer according to claim 1, wherein the end portion of each of the plurality of beam portions has a tapered shape when viewed in the up-down direction.

10. The piezoelectric transducer according to claim 1, wherein the plurality of beam portions include four beam portions that are point-symmetrical to each other with respect to the center point of the piezoelectric transducer.

11. The piezoelectric transducer according to claim 10, wherein each of the four beam portions extends toward the center point of the piezoelectric transducer.

12. The piezoelectric transducer according to claim 1, wherein a width of the gap is constant or substantially constant.

13. The piezoelectric transducer according to claim 1, wherein the piezoelectric layer is made of one of lead zirconate titanate based ceramics, aluminum nitride, lithium niobate, or lithium tantalate;

the upper and lower electrode layers are made of Pt.

14. The piezoelectric transducer according to claim 1, wherein each of the plurality of beam portions further includes an active layer on a lower side of the lower electrode layer.

15. The piezoelectric transducer according to claim 14, wherein the active layer is made of Si.

* * * * *